United States Patent
Hikita et al.

(10) Patent No.: US 9,577,084 B2
(45) Date of Patent: Feb. 21, 2017

(54) SEMICONDUCTOR DEVICE HAVING A SEMICONDUCTOR LAYER STACKED BODY

(71) Applicant: Panasonic Intellectual Property Management Co., Ltd., Osaka (JP)

(72) Inventors: Masahiro Hikita, Hyogo (JP); Hideyuki Okita, Toyama (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 0 days.

(21) Appl. No.: 14/981,831

(22) Filed: Dec. 28, 2015

(65) Prior Publication Data

US 2016/0118489 A1    Apr. 28, 2016

Related U.S. Application Data

(63) Continuation of application No. PCT/JP2014/003234, filed on Jun. 17, 2014.

(30) Foreign Application Priority Data

Jul. 16, 2013    (JP) .................................. 2013-147246

(51) Int. Cl.
*H01L 29/66*    (2006.01)
*H01L 29/778*    (2006.01)
(Continued)

(52) U.S. Cl.
CPC ....... *H01L 29/7787* (2013.01); *H01L 29/1066* (2013.01); *H01L 29/205* (2013.01);
(Continued)

(58) Field of Classification Search
CPC ............... H01L 29/7783; H01L 2924/1305; H01L 29/2003; H01L 29/66462; H01L 21/0254; H01L 29/7787; H01L 21/02458; H01L 21/02389; H01L 21/3245; H01L 29/205; H01L 29/207; H01L 29/7786
See application file for complete search history.

(56) References Cited

U.S. PATENT DOCUMENTS

2009/0212325 A1    8/2009 Sato
2010/0072516 A1*   3/2010 Tamura ............ H01L 21/30617
                                                 257/192
(Continued)

FOREIGN PATENT DOCUMENTS

JP    2009-200395    9/2009
JP    2010-147387    7/2010
(Continued)

OTHER PUBLICATIONS

International Search Report of PCT application No. PCT/JP2014/003234 dated Sep. 2, 2014.

*Primary Examiner* — Khiem D Nguyen
(74) *Attorney, Agent, or Firm* — McDermott Will & Emery LLP

(57) ABSTRACT

A semiconductor device includes a substrate, a semiconductor layer stacked body, and a source electrode and a drain electrode formed on the semiconductor layer stacked body. The semiconductor layer stacked body includes a first nitride semiconductor layer formed on the substrate, and a second nitride semiconductor layer formed on the first nitride semiconductor layer. The semiconductor device further includes a third nitride semiconductor layer formed on the second nitride semiconductor layer and disposed between the source electrode and the drain electrode, and a gate electrode formed on the third nitride semiconductor layer. The semiconductor device includes a first magnesium-containing region having a magnesium concentration of $1\times10^{18}$ cm$^{-3}$ or more that is provided right under the third nitride semiconductor layer, from an upper surface of the second nitride
(Continued)

semiconductor layer to a position lower than an interface between the first nitride semiconductor layer and the second nitride semiconductor layer.

7 Claims, 6 Drawing Sheets

(51) Int. Cl.
*H01L 29/10* (2006.01)
*H01L 29/205* (2006.01)
*H01L 29/207* (2006.01)
*H01L 29/20* (2006.01)

(52) U.S. Cl.
CPC ...... *H01L 29/207* (2013.01); *H01L 29/66462* (2013.01); *H01L 29/7786* (2013.01); *H01L 29/2003* (2013.01)

(56) References Cited

U.S. PATENT DOCUMENTS

| | | |
|---|---|---|
| 2010/0097105 A1 | 4/2010 | Morita et al. |
| 2010/0155780 A1 | 6/2010 | Machida et al. |
| 2011/0037100 A1* | 2/2011 | Hikita ................. H01L 29/2003 257/190 |
| 2012/0217546 A1 | 8/2012 | Machida et al. |
| 2013/0256684 A1* | 10/2013 | Nishimori ........... H01L 29/7783 257/76 |

FOREIGN PATENT DOCUMENTS

| | | |
|---|---|---|
| JP | 2012-227456 | 11/2012 |
| WO | 2008/062800 | 5/2008 |

\* cited by examiner

SEMICONDUCTOR DEVICE HAVING A SEMICONDUCTOR LAYER STACKED BODY

RELATED APPLICATIONS

This application is a Continuation of International Application No. PCT/JP2014/003234, filed on Jun. 17, 2014, which in turn claims priority from Japanese Patent Application No. 2013-147246, filed on Jul. 16, 2013, the contents of all of which are incorporated herein by reference in their entireties.

BACKGROUND

1. Field of the Invention

The present disclosure relates to a semiconductor device applicable to a power switching element which is used in an inverter or a power supply circuit.

2. Description of the Related Art

Recently, as a power switching element, an FET (field effect transistor) composed of a nitride semiconductor material represented by gallium nitride (GaN) has been enthusiastically studied. More specifically, GaN has a bandgap about three times wider than silicon (Si), and its breakdown field intensity is ten times higher than that of Si. Furthermore, compared with Si, GaN has higher electron saturation speed, so that GaN has excellent material characteristics that a device can be operated at high speed. At present, as a power switching element, a MOSFET (metal oxide semiconductor field effect transistor) and an IGBT (insulated gate bipolar transistor) composed of Si are used, but when Si is replaced with GaN in the FET, it is expected that the element can be made smaller and lighter, and a power loss can be reduced.

In order to reduce the power loss, an ON-resistance needs to be low in the power switching element. In addition, in view of safety purposes, a normally-OFF operation in which a current is cut off in a zero-biased state is indispensable. As a technique realizing both of the normally-OFF operation and the low ON-resistance in the FET composed of GaN, there is an example in which a p-type nitride semiconductor layer is used in a gate portion, and a gate recess is formed under the p-type nitride semiconductor layer (in the first exemplary embodiment of Unexamined Japanese Patent Publication No. 2009-200395). With this structure, a two-dimensional electron gas concentration can be reduced right under a gate electrode, so that both of the normally-OFF operation and the low ON-resistance can be achieved.

Furthermore, as another background technique, there is an example in which a diffusion layer of a p-type impurity is formed under a p-type nitride semiconductor layer in a gate portion (in the second exemplary embodiment in the Unexamined Japanese Patent Publication No. 2009-200395). In this example also, similar to the above example, a two-dimensional electron gas concentration can be reduced right under a gate electrode.

SUMMARY

A semiconductor device according to an aspect of the present disclosure includes a substrate, a semiconductor layer stacked body, and a source electrode and a drain electrode formed on the semiconductor layer stacked body. The semiconductor layer stacked body includes a first nitride semiconductor layer formed on the substrate, and a second nitride semiconductor layer formed on the first nitride semiconductor layer and having higher bandgap energy than the first nitride semiconductor layer. The semiconductor device further includes a third nitride semiconductor layer, which is p-type, formed on the second nitride semiconductor layer and disposed between the source electrode and the drain electrode, and a gate electrode formed on the third nitride semiconductor layer. Furthermore, the semiconductor device further includes a first magnesium-containing region having a magnesium concentration of $1 \times 10^{18}$ cm$^{-3}$ or more that is provided right under the third nitride semiconductor layer, from an upper surface of the second nitride semiconductor layer to a position lower than an interface between the first nitride semiconductor layer and the second nitride semiconductor layer.

With this configuration, the magnesium that is at high concentration of $1 \times 10^{18}$ cm$^{-3}$ or more compensates a residual n-type impurity which is a main factor of a gate leak current. The residual n-type impurity is provided due to a lattice defect existing from the second nitride semiconductor layer to the hetero interface between the second and first nitride semiconductor layers in the region right under the p-type third nitride semiconductor layer. Thus, the gate leak current can be reduced.

According to the semiconductor device in the aspect of the present disclosure, a lower surface of the first magnesium-containing region may reach a position lower than the interface between the first nitride semiconductor layer and the second nitride semiconductor layer by a distance between 1 nm and 10 nm (both inclusive).

Furthermore, a semiconductor device in another aspect of the present disclosure includes a substrate and a semiconductor layer stacked body. The semiconductor layer stacked body includes a first nitride semiconductor layer having a recess, a second nitride semiconductor layer formed on the first nitride semiconductor layer except for the recess, and a fourth nitride semiconductor layer stacked so as to cover the first and second nitride semiconductor layers including an inner wall of the recess. The first, second, and fourth nitride semiconductor layers are sequentially formed on the substrate. The second nitride semiconductor layer has higher bandgap energy than the first nitride semiconductor layer. The fourth nitride semiconductor layer has higher bandgap energy than the first nitride semiconductor layer. The semiconductor device further includes a third nitride semiconductor layer, which is p-type, formed on the fourth nitride semiconductor layer at a place above the recess, a gate electrode formed on the third nitride semiconductor layer, and a source electrode and a drain electrode formed on the semiconductor layer stacked body at each of both sides of the third nitride semiconductor layer, respectively. Furthermore, magnesium is added to the fourth nitride semiconductor layer.

Thus, since the fourth nitride semiconductor layer containing magnesium is stacked so as to cover the inner wall of the recess and the first and second nitride semiconductor layers, the magnesium concentration can be controlled with high accuracy, so that the gate leak current can be stably reduced.

According to the semiconductor device in the aspect of the present disclosure, a second magnesium-containing region having a magnesium concentration of $1 \times 10^{18}$ cm$^{-3}$ or more may be provided in the second nitride semiconductor layer except for a region right under the recess, and the second magnesium-containing region has a depth which is equal to a depth of the first magnesium-containing region, from the upper surface of the second nitride semiconductor layer.

Thus, the gate leak current provided through a surface region of the second nitride semiconductor layer can be reduced.

Furthermore, according to the semiconductor device in the aspect of the present disclosure, the recess may have a depth of 1 nm or more.

Thus, the high-concentration magnesium-containing region reaches the hetero interface between the second nitride semiconductor layer (for example, the i-type AlGaN layer) and the first nitride semiconductor layer (for example, the i-type GaN layer), in which high-density lattice defects exist, so that an effect of reducing the gate leak current can be achieved.

According to the semiconductor device in the aspect of the present disclosure, the magnesium concentration of the first magnesium-containing region may be $1 \times 10^{19}$ cm$^{-3}$ or less.

Thus, the magnesium concentration is restricted, or an increase of the lattice defects due to the magnesium is suppressed, so that the two-dimensional electron gas concentration can be prevented from being reduced.

As described above, according to the semiconductor device in the present disclosure, a normally-OFF type semiconductor element can be realized with a gate leak current reduced.

DETAILED DESCRIPTION OF THE PREFERRED EMBODIMENTS

According to a conventional FET using a p-type nitride semiconductor in a gate portion, a gate leak current can be considerably reduced, compared with a Schottky gate electrode structure formed on an AlGaN barrier layer which is a mainstream structure in an FET composed of GaN, but the gate leak current needs to be further reduced in order to achieve the same level of the leak current as that provided in a power switching element composed of Si.

Herein, AlGaN represents mixed crystals of AlN and GaN, that is to say, it is $Al_xGa_{1-x}N$ (0<x<1).

In view of the above requirements, the present disclosure provides a normally-OFF type semiconductor device applicable to a power switching element by reducing the gate leak current.

First Exemplary Embodiment

Figure 1:
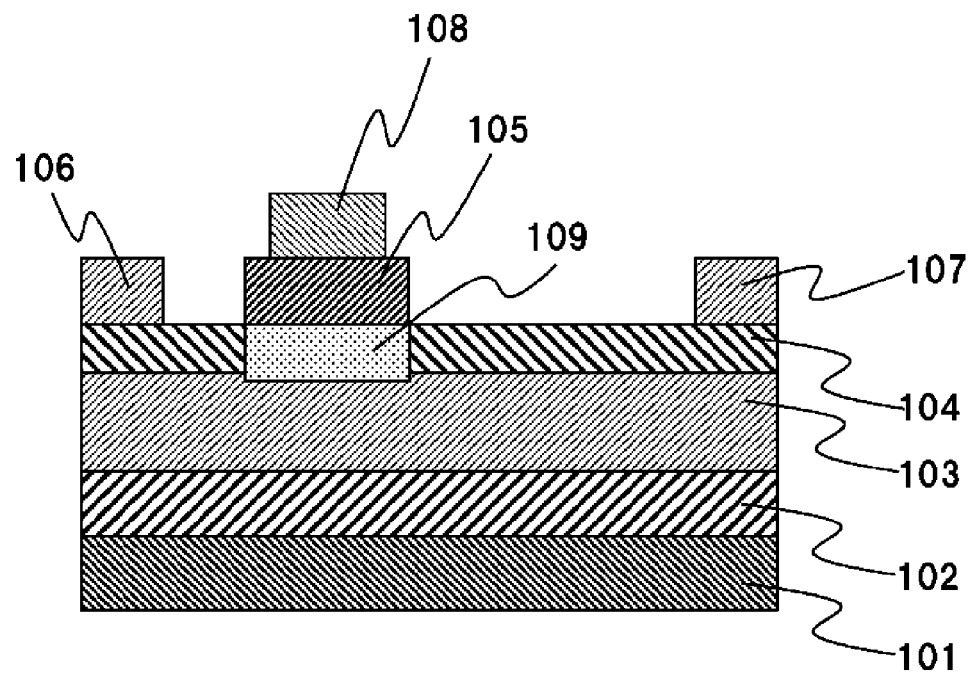
FIG. 1 is a cross-sectional view showing a semiconductor device in a first exemplary embodiment.

FIG. 1 is a cross-sectional view showing a semiconductor device according to this exemplary embodiment. The semiconductor device in this exemplary embodiment is a field effect transistor. As shown in FIG. 1, the semiconductor device in this exemplary embodiment has a configuration in which stacked layers are sequentially formed on substrate 101 composed of Si. The stacked layers include buffer layer 102 having a thickness of 2 μm, undoped i-type GaN layer 103 having a thickness of 2 μm, i-type AlGaN layer 104 having a thickness of 25 nm and an Al composition ratio of 15%, and p-type GaN layer 105 having a thickness of 200 nm. Buffer layer 102 has a stacked structure in which an AlN layer (not shown) and AlGaN layer (not shown) are alternately formed several times. Furthermore, p-type GaN layer 105 is locally formed on a predetermined region (hereinafter, referred to as a gate region) of i-type AlGaN layer 104. Here, the term "undoped (i-type)" means that an impurity is not intentionally doped in a semiconductor layer when the semiconductor layer is epitaxially grown. Gate electrode 108 composed of palladium (Pd) is formed on p-type GaN layer 105. Furthermore, source electrode 106 and drain electrode 107 are each composed of titanium (Ti) and aluminum (Al) and are formed on i-type AlGaN layer 104. Furthermore, p-type GaN layer 105 and gate electrode 108 are connected by an ohmic contact.

In addition, source electrode 106 and i-type AlGaN layer 104, and drain electrode 107 and i-type AlGaN layer 104 are connected by an ohmic contact, respectively. That is to say, each of source electrode 106 and drain electrode 107 is electrically connected to a two-dimensional electron gas channel (not shown) formed in a hetero interface between i-type AlGaN layer 104 and i-type GaN layer 103. Furthermore, in a case where i-type AlGaN layer 104 is partly formed on i-type GaN layer 103, source electrode 106 and drain electrode 107 may be formed on a region of i-type GaN layer 103 in which i-type AlGaN layer 104 is not formed.

Furthermore, p-type GaN layer 105 and gate electrode 108 are formed at a position closer to source electrode 106. This is because an electric field generated when a high drain voltage is applied can be relaxed by the large distance provided between gate electrode 108 and drain electrode 107. Thus, a breakdown voltage of a semiconductor element can be improved. For example, in a case of a power switching element having a withstand voltage of 600 V, a distance between p-type GaN layer 105, which is a gate portion, and drain electrode 107 is preferably 10 µm to 20 µm, and it is 10 µm in this exemplary embodiment. In addition, a distance between source electrode 106 and gate electrode 108 is 1 µm, and a gate length is 1 µm. Here, the gate length means a width of p-type GaN layer 105 in a direction from source electrode 106 to drain electrode 107.

Here, p-type GaN layer 105 except for a region near its surface is mostly doped with magnesium (Mg) at a concentration of about $5\times10^{19}$ cm$^{-3}$, and a carrier concentration is about $5\times10^{17}$ cm$^{-3}$. A region (not shown) by a depth of about 10 nm from the surface of p-type GaN layer 105 is doped with Mg at a concentration of about $2\times10^{20}$ cm$^{-3}$. In his exemplary embodiment, magnesium-containing region 109 having a Mg concentration of $1\times10^{18}$ cm$^{-3}$ or more is formed right under p-type GaN layer 105 in the gate region, from a surface of i-type AlGaN layer 104 to the hetero interface between i-type AlGaN layer 104 and i-type GaN layer 103. As for the Mg concentration in p-type GaN layer 105, a concentration of about $1\times10^{19}$ cm$^{-3}$ is enough to turn the layer into the p type, but in the present disclosure, p-type GaN layer 105 is doped with Mg at a concentration which is several times higher than about $1\times10^{19}$ cm$^{-3}$ which is enough to turn the layer into the p type, so that Mg can be readily thermally diffused from p-type GaN layer 105.

Furthermore, i-type GaN layer 103 or i-type AlGaN layer 104 normally has high-density lattice defects due to non-bonded nitrogen atoms. This lattice defect acts as a residual n-type impurity, so that even when the layer is not doped, it is equivalent to a layer doped with an n-type impurity at a concentration of about $1\times10^{16}$ cm$^{-3}$. In magnesium-containing region 109, Mg that is a p-type impurity compensates the residual n-type impurity. An activation rate of Mg in GaN or AlGaN is about 1% in general, so that the Mg concentration in magnesium-containing region 109 needs to be $1\times10^{18}$ cm$^{-3}$ or more which is hundred times higher than the residual n-type impurity concentration.

The inventors of the present disclosure have found that when the magnesium-containing region having a high Mg concentration of $1\times10^{18}$ cm$^{-3}$ or more is formed up to the hetero interface of a channel, the gate leak current can be ten times or more reduced, compared with the conventional FET. This reduction is considered because the diffused high-concentration Mg compensates the residual n-type impurity due to the lattice defect formed in the nitride semiconductor layer in the gate region and its hetero interface. Therefore, according to this exemplary embodiment, the gate leak current caused by the residual n-type impurity can be reduced.

When magnesium-containing region 109 having the high Mg concentration of $1\times10^{18}$ cm$^{-3}$ or more is formed up to the hetero interface between i-type AlGaN layer 104 and i-type GaN layer 103, a resistance of the two-dimensional electron gas channel is high in magnesium-containing region 109. However, as for the FET in the present disclosure, the gate length is small compared with the distance between source electrode 106 and drain electrode 107, and a channel length of magnesium-containing region 109 having the high Mg concentration of $1\times10^{18}$ cm$^{-3}$ or more only accounts for 1/10 or less in a total channel length, so that the above high resistance has little effect on a rise in ON-resistance of the FET.

Furthermore, in order to achieve a sufficient effect of reducing the gate leak current, magnesium-containing region 109 having the high Mg concentration of $1\times10^{18}$ cm$^{-3}$ or more needs to at least reach the hetero interface between i-type AlGaN layer 104 and i-type GaN layer 103 having the high-density lattice defects, and preferably exceeds the interface a little. More specifically, magnesium-containing region 109 provided right under p-type GaN layer 105 has only to reach up to a depth of 1 nm or more in i-type GaN layer 103. However, when magnesium-containing region 109 is formed beyond a depth of 10 nm in i-type GaN layer 103, the resistance of the two-dimensional electron gas channel becomes high, which is not preferable.

In addition, when the Mg concentration is too high, the undoped layer comes to be the p type or the lattice defects due to Mg are increased, which causes a reduction in two-dimensional electron gas concentration and an increase in channel resistance, so that the concentration is preferably $1\times10^{19}$ cm$^{-3}$ or less.

Second Exemplary Embodiment

Figure 2:
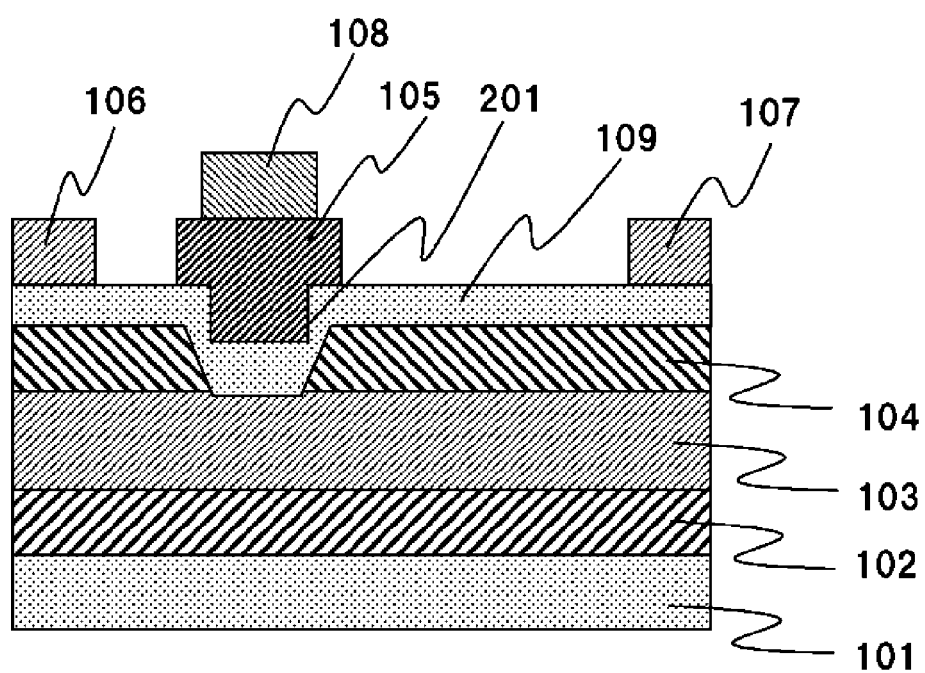
FIG. 2 is a cross-sectional view showing a semiconductor device in a second exemplary embodiment.

FIG. 2 is a cross-sectional view showing a semiconductor device according to the second exemplary embodiment of the present disclosure. In FIG. 2, the same component as in FIG. 1 is marked with the same reference numeral and its description is omitted.

According to the semiconductor device in this exemplary embodiment, i-type AlGaN layer 104 has an Al composition ratio of 15% and has a large thickness of 60 nm. In addition, gate recess 201 having a depth of 35 nm is formed from a surface of i-type AlGaN layer 104, and p-type GaN layer 105 is formed so as to fill gate recess 201. Furthermore, magnesium-containing region 109 reaches a hetero interface between i-type AlGaN layer 104 and i-type GaN layer 103 in a region right under gate recess 201. A Mg concentration of magnesium-containing region 109 is $1\times10^{18}$ cm$^{-3}$ or more.

Except for a region right under gate recess 201, magnesium-containing region 109 having the same depth as that right under gate recess 201 is uniformly formed in the surface region of i-type AlGaN layer 104. Here, a width of a bottom portion of gate recess 201 is 1 µm in direction from source electrode 106 to drain electrode 107.

Thus, by thickening i-type AlGaN layer 104 and forming gate recess 201, a channel resistance except for that in the gate region can be lowered, and an ON-resistance of the semiconductor device can be lowered.

In the region right under gate recess 201, similarly to the first exemplary embodiment, the high-concentration Mg compensates a residual n-type impurity due to a lattice defect formed in a hetero interface of a channel, so that a gate leak current can be reduced. As described above, even if magnesium-containing region 109 having the high concentration of $1\times10^{18}$ cm$^{-3}$ or more is uniformly formed in the surface region of i-type AlGaN layer 104 except for the region right under gate recess 201, the channel resistance can be prevented from becoming high except for the region right under gate recess 201. This is because high-concentration magnesium-containing region 109 does not reach the hetero interface between i-type AlGaN layer 104 and i-type GaN layer 103 except for the region right under gate recess 201. Furthermore, when high-concentration magnesium-containing region 109 is formed in the surface region of i-type AlGaN layer 104, a gate leak current caused by the residual n-type impurity in the surface region of i-type AlGaN layer 104 can be reduced in a gate leak current path extending from drain electrode 107 to p-type GaN layer 105.

Figure 3A:
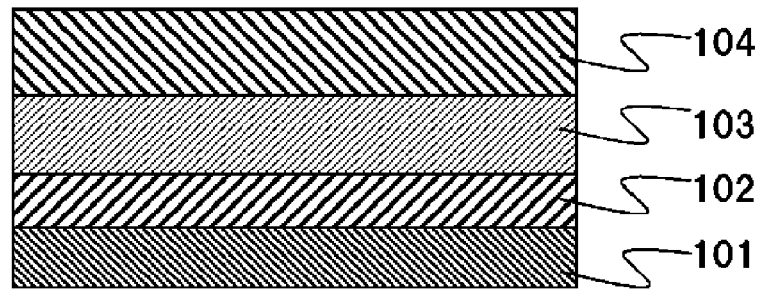
FIG. 3A is a cross-sectional view showing a method for manufacturing the semiconductor device in the second exemplary embodiment.

Hereinafter, a method for manufacturing the semiconductor device in the second exemplary embodiment will be described with reference to FIGS. 3A to 3C and FIGS. 4A to 4C. Steps shown in FIGS. 4A to 4C are performed following steps shown in FIGS. 3A to 3C. First, as shown in FIG. 3A, by using MOCVD (metal organic chemical vapor deposition), buffer layer 102 having a thickness of 2 μm and including stacked layers of AlN and AlGaN, i-type GaN layer 103 having a thickness of 2 μm, and i-type AlGaN layer 104 having a thickness of 60 nm and having an Al composition ratio of 15% are epitaxially grown in a sequential manner on substrate 101 composed of Si.

Figure 3B:
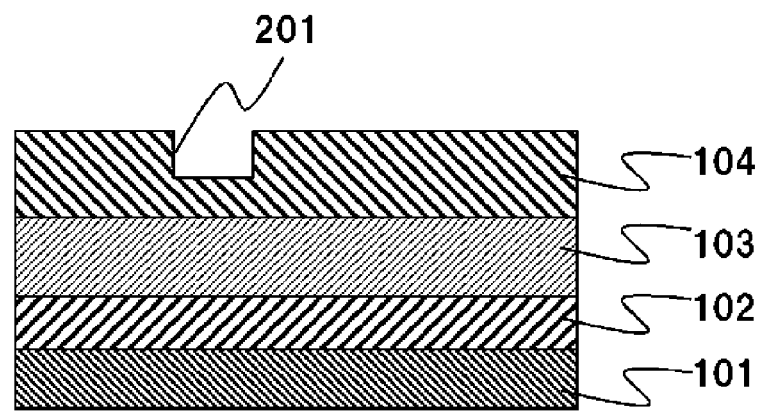
FIG. 3B is a cross-sectional view showing a method for manufacturing the semiconductor device in the second exemplary embodiment.
Figure 4A:
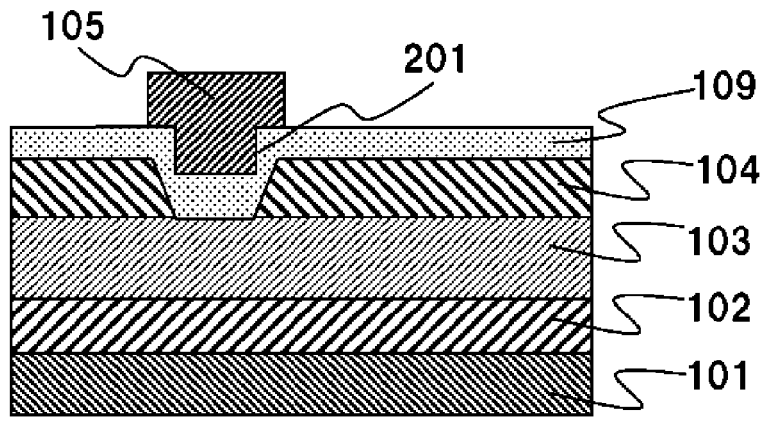
FIG. 4A is a cross-sectional view showing a method for manufacturing the semiconductor device in the second exemplary embodiment.
Figure 4B:
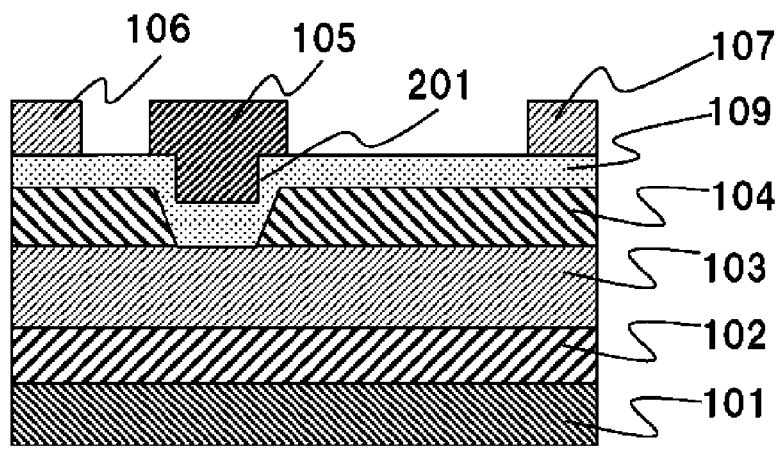
FIG. 4B is a cross-sectional view showing a method for manufacturing the semiconductor device in the second exemplary embodiment.
Figure 4C:
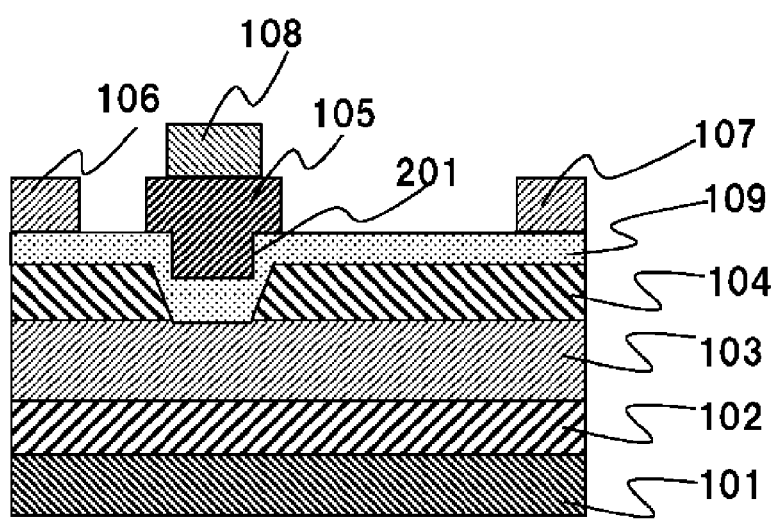
FIG. 4C is a cross-sectional view showing a method for manufacturing the semiconductor device in the second exemplary embodiment.

Subsequently, as shown in FIG. 3B, a part of i-type AlGaN layer 104 in the gate region is removed by dry etching such as ICP (inductive-coupled plasma) etching with a chlorine gas, for example, whereby gate recess 201 having a depth of 35 nm is formed.

Figure 3C:
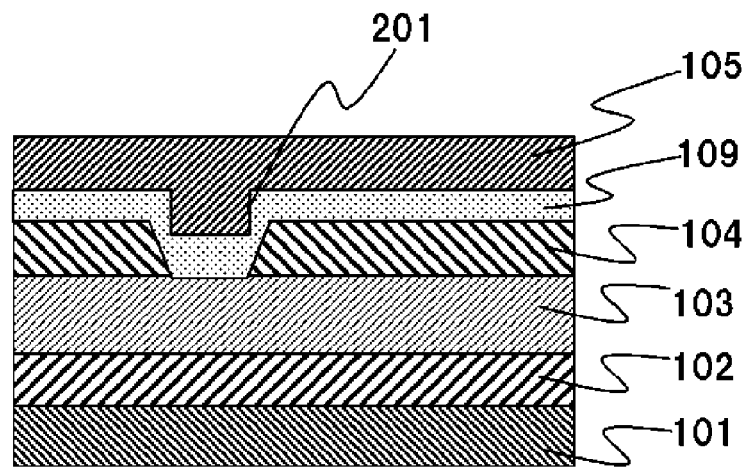
FIG. 3C is a cross-sectional view showing a method for manufacturing the semiconductor device in the second exemplary embodiment.

Subsequently, as shown in FIG. 3C, p-type GaN layer 105 having a thickness of 200 nm is formed through epitaxial growth by MOCVD. In this case, magnesium-containing region 109 having a depth of about 30 nm is formed by the epitaxial growth or thermal diffusion after the epitaxial growth. The concentration and the depth of magnesium-containing region 109 can be controlled by a heat treatment temperature during or after the epitaxial growth of p-type GaN layer 105 and a Mg concentration in p-type GaN layer 105. For example, the heat treatment is performed at about 1000° C. during the growth. In order to form magnesium-containing region 109 having the concentration of $1 \times 10^{18}$ cm$^{-3}$ or more up to a depth reaching the channel, the Mg concentration in p-type GaN layer 105 is preferably set at a high concentration of about $5 \times 10^{19}$ cm$^{-3}$. In addition, an impurity serving as an n-type dopant such as carbon (C) or oxygen (O) is taken into a crystal in an epitaxial growth interface, which causes an increase in gate leak current, but Mg in magnesium-containing region 109 compensates the impurity, so that the gate leak current can be prevented from increasing.

Subsequently, as shown in FIG. 4A, a part of p-type GaN layer 105 which is formed on a region other than the gate region is selectively removed by dry etching such as ICP etching. At this time, a selective etching by using a chlorine gas with an oxygen gas is preferably performed so that etching rate of i-type AlGaN layer 104 is lower than that of p-type GaN layer 105.

Subsequently, as shown in FIG. 4B, a Ti layer and an Al layer are formed and subjected to a heat treatment at 600° C. in a nitrogen atmosphere, whereby source electrode 106 and drain electrode 107 are formed, respectively.

Subsequently, as shown in FIG. 4C, gate electrode 108 composed of Pd is formed on p-type GaN layer 105.

In the above description, since magnesium-containing region 109 is formed when p-type GaN layer 105 is epitaxially grown, the depth of magnesium-containing region 109 under p-type GaN layer 105 is equal to the depth of magnesium-containing region 109 formed in i-type AlGaN layer 104 where p-type GaN layer 105 has been etched away. However, in a case where magnesium-containing region 109 is formed through a heat treatment after p-type GaN layer 105 has been etched away as shown in FIG. 4A, magnesium-containing region 109 under p-type GaN layer 105 is deeper. In this case also, the gate leak current can be similarly reduced.

As described above, irrespective of whether magnesium-containing region 109 is formed before or after the dry etching of p-type GaN layer 105, the depth of magnesium-containing region 109 right under gate recess 201 is equal to or greater than the depth of magnesium-containing region 109 formed on the region other than the gate region.

The inventors of the present disclosure made and examined the FETs shown in FIG. 2 with the heat treatment temperature of p-type GaN layer 105 used as a parameter. That is to say, sample A, sample B and sample C were made at 970° C., 980° C., and 1000° C., respectively in the heat treatment to form p-type GaN layer 105. Table 1 shows a relationship between a gate leak current, and a distance that magnesium-containing region 109 exceeds the hetero interface between i-type AlGaN layer 104 and i-type GaN layer 103 in each sample.

TABLE 1

|  | Sample A | Sample B | Sample C |
| --- | --- | --- | --- |
| Heat treatment temperature for p-type GaN layer 105 | 970° C. | 980° C. | 1000° C. |
| Gate leak current | 2 μA | 1 μA | 0.1 μA |
| Mg diffused distance from hetero interface | ~0 nm | <1 nm | 10 nm |

Herein, a value of the gate leak current is obtained when a voltage between source electrode 106 and drain electrode 107 is 600 V.

As shown in Table 1, as the heat treatment temperature for p-type GaN layer 105 is higher, the Mg diffused distance is increased, and the gate leak current is reduced. As for sample C particularly, the gate leak current is 1/20 or less compared to that of sample A. This is considered that the diffused high-concentration Mg compensates the residual n-type impurity due to the lattice defect formed in the nitride semiconductor layer and its hetero interface in the gate region.

Third Exemplary Embodiment

Figure 5:
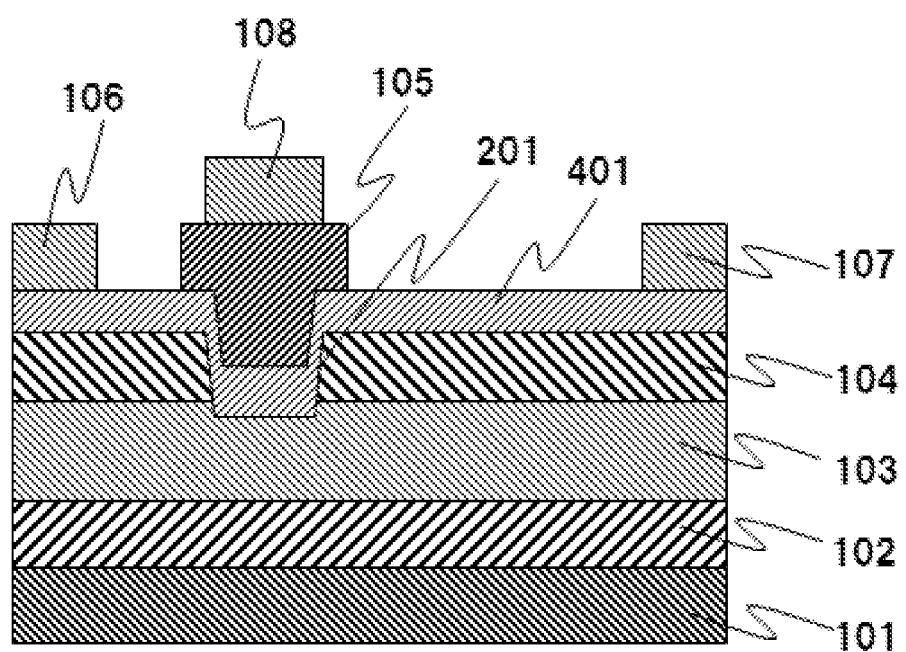
FIG. 5 is a cross-sectional view showing a semiconductor device in a third exemplary embodiment.

FIG. 5 is a cross-sectional view of a semiconductor device according to the third exemplary embodiment of the present disclosure. In FIG. 5, the same component as in FIG. 2 is marked with the same reference numeral and its description is omitted.

According to the semiconductor device in this exemplary embodiment, i-type AlGaN layer 104 having a thickness of 35 nm and an Al composition ratio of 15%, and Mg-doped AlGaN layer 401 having a thickness of 25 nm and an Al composition ratio of 15% are sequentially stacked on i-type GaN layer 103, which serve as a channel, except for a region right under p-type GaN layer 105 in a gate region. In gate recess 201 right under p-type GaN layer 105, i-type AlGaN layer 104 is completely removed to form a second recess. In i-type GaN layer 103, a recess (first recess) having a depth of about 10 nm is formed. In addition, a channel is formed in a hetero interface between Mg-doped AlGaN layer 401 and i-type GaN layer 103, A Mg concentration of Mg-doped AlGaN layer 401 is about $2 \times 10^{18}$ cm$^{-3}$. Here, a width of a bottom portion of gate recess 201 is 1 μm in a direction from source electrode 106 to drain electrode 107.

Since the recess formed in i-type GaN layer 103 is filled with Mg-doped AlGaN layer 401, Mg is not necessarily required to be diffused. Mg in Mg-doped AlGaN layer 401 compensates a residual n-type impurity due to a lattice defect formed in the hetero interface of the channel, so that a gate leak current caused by the residual n-type impurity can be reduced.

Figure 6A:
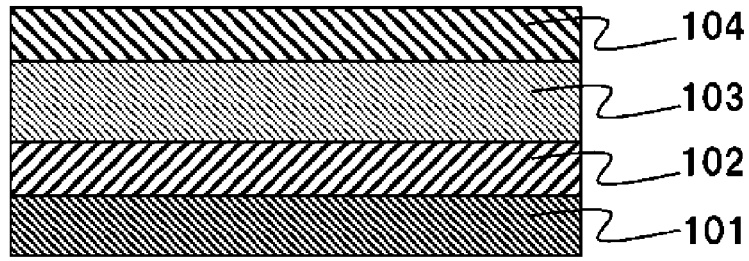
FIG. 6A is a cross-sectional view showing a method for manufacturing the semiconductor device in the third exemplary embodiment.

Hereinafter, a method for manufacturing the semiconductor device in the third exemplary embodiment will be described with reference to FIGS. 6A to 6C and FIGS. 7A to 7C. Steps shown in FIGS. 7A to 7C are performed following steps shown in FIGS. 6A to 6C. First, as shown in FIG. 6A, by MOCVD, buffer layer 102, i-type GaN layer 103, and i-type AlGaN layer 104 are epitaxially grown in a sequential manner on Si substrate 101.

Figure 6B:
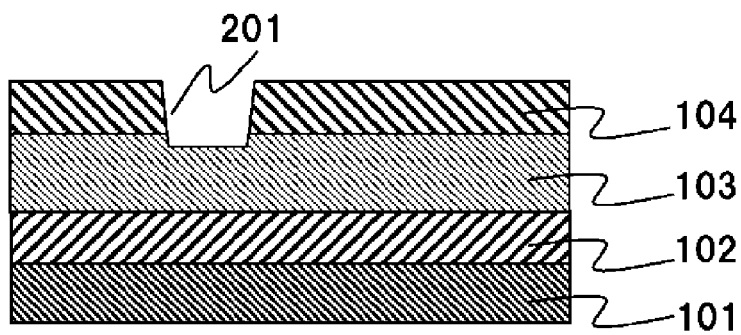
FIG. 6B is a cross-sectional view showing a method for manufacturing the semiconductor device in the third exemplary embodiment.
Figure 7A:
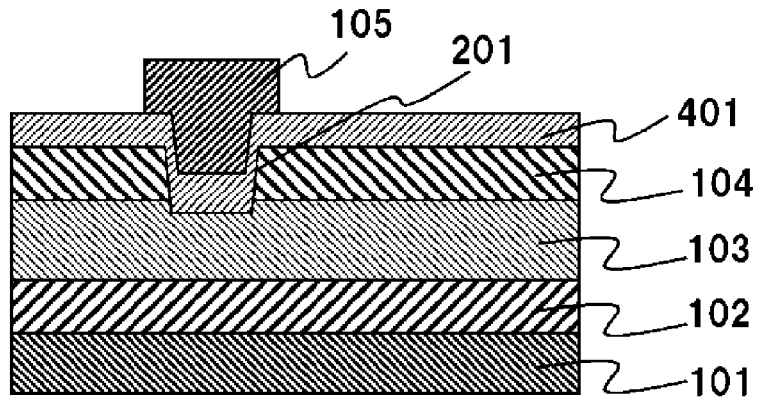
FIG. 7A is a cross-sectional view showing a method for manufacturing the semiconductor device in the third exemplary embodiment.
Figure 7B:
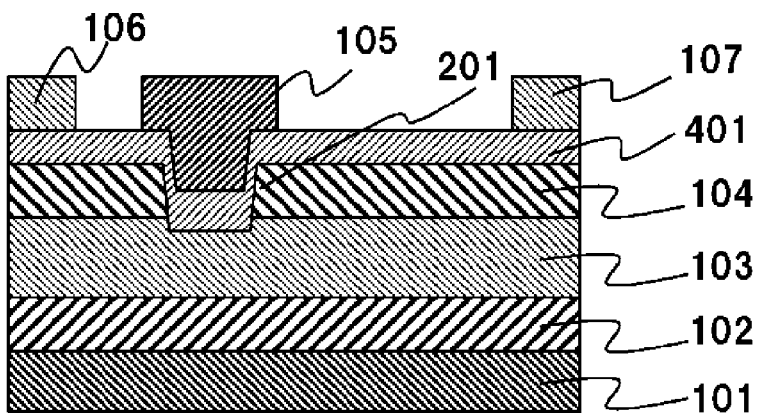
FIG. 7B is a cross-sectional view showing a method for manufacturing the semiconductor device in the third exemplary embodiment.
Figure 7C:
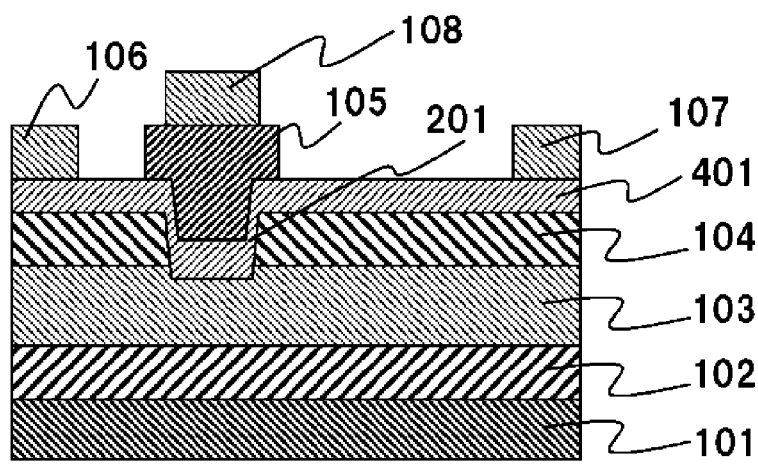
FIG. 7C is a cross-sectional view showing a method for manufacturing the semiconductor device in the third exemplary embodiment.

Subsequently, as shown in FIG. 6B, gate recess 201 is formed by ICP dry etching or the like. At this time, the etching is performed so that i-type AlGaN layer 104 is completely removed, and gate recess 201 reaches i-type GaN layer 103. An etched depth of i-type GaN layer 103 needs to be at least 1 nm. The etched depth is to be determined by consideration of a variation in thickness of i-type AlGaN layer 104 and a variation in dry etching rate so that i-type AlGaN layer 104 can be completely removed. Meanwhile, if the i-type GaN layer 103 is etched too deeply, the channel is largely curved, and a channel resistance becomes high, so that the depth is preferably about 50 nm or less.

Figure 6C:
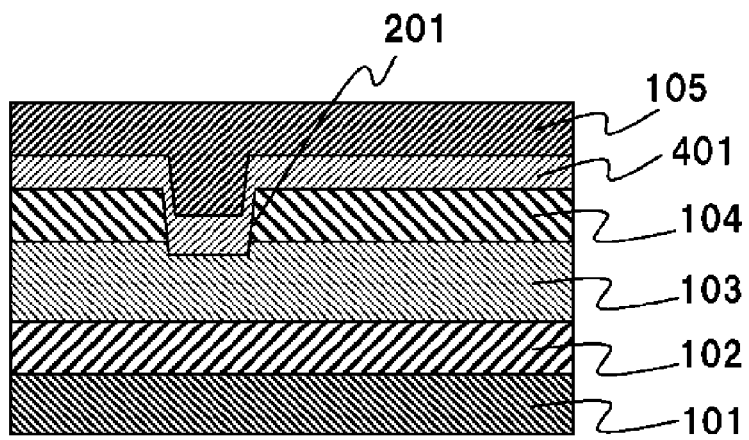
FIG. 6C is a cross-sectional view showing a method for manufacturing the semiconductor device in the third exemplary embodiment.

Subsequently, as shown in FIG. 6C, Mg-doped AlGaN layer 401 having a thickness of 25 nm, and p-type GaN layer 105 having a thickness of 200 nm are sequentially formed through epitaxial growth by MOCVD. At this time of the epitaxial growth, an impurity serving as n-type dopant such as C or O is taken into a crystal in an epitaxial growth interface, which causes an increase in gate leak current, but Mg in Mg-doped AlGaN layer 401 compensates the impurity, so that the gate leak current is prevented from being increased.

Subsequently, p-type GaN layer 105 in a region except for the gate region is selectively removed by ICP dry etching or the like (FIG. 7A), and then source electrode 106 and drain electrode 107 are formed (FIG. 7B). Finally, gate electrode 108 is formed on p-type GaN layer 105 (FIG. 7C).

According to this exemplary embodiment, the Mg concentration in the hetero interface of the channel is controlled by a doping amount in Mg-doped AlGaN layer 401 at the time of the crystal growth, so that the Mg concentration can be well controlled compared with the case of the thermal diffusion, and consequently, the gate leak current can be stably reduced.

Furthermore, while the thickness of Mg-doped AlGaN layer 401 in the gate recess serves as an important parameter to determine a threshold voltage of the semiconductor device, the thickness is determined only by the epitaxial growth in FIG. 6C, so that the threshold voltage can be well controlled, and prevented from varying.

According to the above exemplary embodiments, the p-type nitride semiconductor layer is the GaN layer, but it may be a p-type AlGaN layer having an Al composition ratio equal to or less than that of the i-type AlGaN layer formed below. The p-type nitride semiconductor layer may be a p-type AlGaN layer having an Al composition ratio of about 10%, or a stacked layer with the p-type GaN layer.

Furthermore, the i-type GaN layer and the i-type AlGaN layer may be an n-type GaN layer and an n-type AlGaN layer, respectively.

Furthermore, instead of the i-type GaN layer, an i-type $Al_{x1}Ga_{1-x1-y1}In_{y1}N$ layer ($0 \leq x1 < 1$, $0 \leq y1 \leq 1$, and a bandgap is Eg1) may be used, and instead of the i-type AlGaN layer, an i-type $Al_{x2}Ga_{1-x2-y2}In_{y2}N$ layer ($0 \leq x2 \leq 1$, $0 \leq y2 < 1$, and a bandgap is Eg2) may be used. Here, it is to be noted that Eg1<Eg2.

Furthermore, instead of the p-type GaN layer, a p-type $Al_{x3}Ga_{1-x3-y3}In_{y3}N$ layer ($0 \leq x3 \leq 1$, $0 \leq y3 \leq 1$) may be used.

Furthermore, while the substrate is composed of Si in the semiconductor device in the above example, the substrate may be composed of sapphire, SiC or GaN as long as the nitride semiconductor layer can be formed on it.

According to the semiconductor device in the present disclosure, power consumption is low, and the gate leak current can be reduced to a practically problem-free level, so that the semiconductor device is useful as a power switching element which is used in an inverter or a power supply circuit.

What is claimed is:

1. A semiconductor device comprising:
   a substrate;
   a semiconductor layer stacked body including a first nitride semiconductor layer formed on the substrate, and a second nitride semiconductor layer formed on the first nitride semiconductor layer and having a higher bandgap energy than the first nitride semiconductor layer;
   a source electrode and a drain electrode formed on the semiconductor layer stacked body;
   a third nitride semiconductor layer of p-type formed on the second nitride semiconductor layer, and disposed between the source electrode and the drain electrode; and
   a gate electrode formed on the third nitride semiconductor layer, wherein
   a first magnesium-containing region having a magnesium concentration of $1 \times 10^{18}$ cm$^{-3}$ or more is provided right under the third nitride semiconductor layer, from an upper surface of the second nitride semiconductor layer to a position lower than an interface between the first nitride semiconductor layer and the second nitride semiconductor layer.

2. The semiconductor device according to claim 1, wherein
   a lower surface of the first magnesium-containing region reaches a position lower than the interface between the first nitride semiconductor layer and the second nitride semiconductor layer by a distance of 1 nm or more and 10 nm or less.

3. The semiconductor device according to claim 1, wherein
   the magnesium concentration of the first magnesium-containing region is $1 \times 10^{19}$ cm$^{-3}$ or less.

4. The semiconductor device according to claim 1, wherein
   a recess is formed in the upper surface of the second nitride semiconductor layer, right under the third nitride semiconductor layer, and the recess is filled with the third nitride semiconductor layer.

5. The semiconductor device according to claim 4, wherein
   a magnesium is contained in the second nitride semiconductor layer except for a region right under the recess at a magnesium concentration of $1 \times 10^{18}$ cm$^{-3}$ or more, from the upper surface of the second nitride semiconductor layer to a depth which is equal to a depth of the first magnesium-containing region right under the third nitride semiconductor layer.

6. A semiconductor device comprising:
   a substrate;
   a semiconductor layer stacked body including a first nitride semiconductor layer having a recess, a second nitride semiconductor layer having a higher bandgap energy than the first nitride semiconductor layer and formed on the first nitride semiconductor layer except for the recess, and a fourth nitride semiconductor layer stacked so as to cover the first and second nitride semiconductor layers including an inner wall of the recess, and having a higher bandgap energy than the first nitride semiconductor layer, wherein the first, second, and fourth nitride semiconductor layers are sequentially formed on the substrate;
   a third nitride semiconductor layer of p-type formed on the fourth nitride semiconductor layer at a place above the recess;

a gate electrode formed on the third nitride semiconductor layer; and a source electrode and a drain electrode formed on the semiconductor layer stacked body at each of both sides of the third nitride semiconductor layer, respectively, wherein magnesium is added to the fourth nitride semiconductor layer.

7. The semiconductor device according to claim 6, wherein the recess has a depth of 1 nm or more.

* * * * *